(12) United States Patent
Ford et al.

(10) Patent No.: US 7,807,934 B2
(45) Date of Patent: Oct. 5, 2010

(54) PRINTED CIRCUIT BOARD HAVING PROTECTION MEANS AND A METHOD OF USE THEREOF

(76) Inventors: Peter Ford, Victoria Road, Saltaire, Shipley, BD18 3LF (GB); Colin Fuller, Victoria Road, Saltaire, Shipley, BD18 3LF (GB)

( * ) Notice: Subject to any disclaimer, the term of this patent is extended or adjusted under 35 U.S.C. 154(b) by 877 days.

(21) Appl. No.: 11/430,335

(22) Filed: May 9, 2006

(65) Prior Publication Data

US 2008/0180922 A1 Jul. 31, 2008

(30) Foreign Application Priority Data

May 10, 2005 (GB) .................................. 0509483.4

(51) Int. Cl.
*H01L 23/28* (2006.01)
*H05K 3/36* (2006.01)
(52) U.S. Cl. .......................... 174/521; 174/252; 29/830

(58) Field of Classification Search ................. 174/252, 174/521–534; 29/830
See application file for complete search history.

(56) References Cited

U.S. PATENT DOCUMENTS

| 6,526,653 | B1 * | 3/2003 | Glenn et al. ................... 29/830 |
| 6,601,293 | B1 * | 8/2003 | Glenn .......................... 29/841 |
| 2003/0030065 | A1 * | 2/2003 | Wu ............................. 257/98 |

* cited by examiner

*Primary Examiner*—Jeremy C Norris
(74) *Attorney, Agent, or Firm*—Head, Johnson & Kachigian, P.C.

(57) ABSTRACT

A printed circuit board is provided with protection means for protecting one or more components of the printed circuit board (PCB). The protection means includes a sleeve member located on the PCB around at least one component of the PCB. The protection means further includes cover means for covering a whole or substantial part of an opening of said sleeve member. The cover means is formed from or includes mica.

21 Claims, 2 Drawing Sheets

PRINTED CIRCUIT BOARD HAVING PROTECTION MEANS AND A METHOD OF USE THEREOF

CROSS-REFERENCE TO RELATED APPLICATION

This United States patent application entitled "A Printed Circuit Board Having Protection Means And A Method Of Use Thereof" claims priority to British Application No. 0509483.4 filed 10 May 2005.

STATEMENT REGARDING FEDERALLY SPONSORED RESEARCH DEVELOPMENT (N/A)

INCORPORATED BY-REFERENCE OF MATERIAL SUBMITTED ON A COMPACT DISC (N/A)

BACKGROUND OF THE INVENTION

This invention relates to protection means for a printed circuit board (PCB) and a method of use of protection means for a PCB.

PCB's typically include at least an upper and lower surface with one or more electrical components located on one or both surfaces thereof. The PCB is then located in an item of electrical apparatus in use. It is often a requirement that one or more of the electrical components on the PCB are required to be covered with a fluid, such as an adhesive, to maintain the component in a suitable position on the PCB in use and to protect the same from damage, environmental conditions, tampering and/or the like. An example of such a component is a flash memory device. However, it is difficult to ensure that the adhesive is applied around the component to a pre-determined thickness which is reproducible for each PCB in a manner which is cost effective and which is not time consuming. It is also difficult to ensure that the adhesive does not flow onto any other component on the PCB which is not required to be covered by the adhesive since this may cause damage to the other component or make the same unserviceable. This also typically results in wastage of adhesive which increases the cost of producing the PCB.

It is known to provide a plastic rim around an integrated circuit chip on a circuit board and to locate a soft gel medium within the rim and surrounding the chip, as disclosed in EP788617. A plate made of plastic or metal is attached to the top surface of the plastic rim in order to provide a cover for the package to allow the conduction of heat generated by the chip during use away from the chip. However, EP788617 is not concerned with preventing tampering or unauthorised access to the chip.

BRIEF SUMMARY OF THE INVENTION

It is an aim of the present invention to provide alternative protection means for use on PCBs.

It is a further aim of the present invention to provide an alternative method of protecting one or more components of a PCB.

According to a first aspect of the present invention there is provided a printed circuit board with protection means for protecting one or more components of the printed circuit board (PCB), said protection means including a sleeve member located on the PCB around at least one component of the PCB, said protection means further including cover means for covering a whole or substantial part of an opening of said sleeve member, and wherein the cover means is formed from or includes mica.

Thus, the present invention differs from the prior art in that mica, having high heat resistance and insulating properties, is used rather than a heat conducting material or simply plastic having much lower heat resistant properties. This allows the present invention to effectively dissipate heat applied to the cover means on the PCB by third parties trying to access the one or more components covered by the protection means, thereby significantly increasing the security of the PCB and/ or covered components and preventing tampering therewith. The prior art devices are concerned only with conducting heat generated by the component during use away from the component to allow the device.

The sleeve member acts to limit the spread of a product or fluid located within a cavity defined by the interior walls of the sleeve member. The cover means acts to prevent or limit access to the interior of the sleeve member and to the component surrounded by the sleeve member.

Preferably the sleeve member is of such dimensions so as to allow a fluid to be located within the cavity defined by the interior walls of the sleeve member to a required depth over the component being protected.

Preferably the sleeve member allows a depth of fluid of at least 3 mm to be located in the cavity defined by the sleeve member. In use, the sleeve member can be filled with the fluid to a pre-determined height/depth when located around the component, thereby ensuring accurate and reproducible amounts of fluid around the component.

The fluid can be any required fluid, such as solder, adhesive and/or the like.

In one embodiment the sleeve member has side walls with at least a first and second opening defined therein. The sleeve member is arranged on the PCB so that the edges of the member defining the first opening are adjacent and in contact with the surface of the PCB on which the component to be protected is located.

Preferably the second opening is provided substantially opposite the first opening. The cover means can be provided over the second opening.

The sleeve member, or at least the cross sectional shape of the first opening, is formed of any suitable shape for locating around the component to be protected. For example, the cross sectional dimensions of the sleeve member can be slightly larger than the component about which it is located or can be substantially larger than the component being protected.

Preferably the sleeve member is of such dimensions that a pre-determined space is provided between the component within the sleeve member and interior walls of the sleeve member.

Preferably the one or more components are electronic components for use on a PCB. For example, the component can include a FLASH memory component or a CPU component (central processing unit).

Preferably the sleeve member is provided with engagement means thereon for allowing the sleeve member to be engaged with the PCB. The cover means and/or sleeve member can be provided with engagement means to allow engagement therebetween.

The engagement means in one example includes one or more pins for location in one or more recesses or apertures on a surface of the PCB. The pins typically protrude outwardly of the sleeve member adjacent one or more edges thereof defining the at least first opening.

Preferably the sleeve member is formed from a heat resistant or heat insulating material. The cover means and the sleeve member can be formed from the same material or a different material.

In one example the sleeve member is formed from a plastics material, such as glass filled nylon.

The sleeve member can be integrally formed or can be formed from a plurality of members joined together.

Thus, the protection means of the present invention provides a dam or box like arrangement for a component for limiting the spread of a fluid, such as adhesive, which is to be located around a component, whilst also allowing the correct depth of fluid to be provided around the component. It is a cost effective method which can be undertaken both quickly and easily. Furthermore, the present invention provides increased security against tampering due to the use of a mica cover on the sleeve member.

The cover can be formed partially from mica but in a preferred embodiment the cover is formed substantially entirely from mica. Any suitable mica material can be used.

The PCB can be for use in any item of electrical apparatus, such as for example a broadcast data receiver or set top box.

According to a second aspect of the present invention there is provided protection means for use with a PCB.

According to a further aspect of the present invention there is provided a method of protecting one or more components of a PCB, said method including the steps of locating a sleeve member around at least one component on a PCB, locating a product or fluid in the cavity defined by interior walls of the sleeve member to cover a whole or part of the component and then locating cover means over an opening of said sleeve member, said sleeve member formed from or includes mica.

DESCRIPTION OF THE DRAWINGS

An embodiment of the present invention will now be described with reference to the accompanying figures, wherein.

DESCRIPTION OF THE PREFERRED EMBODIMENTS

Figure 1A:
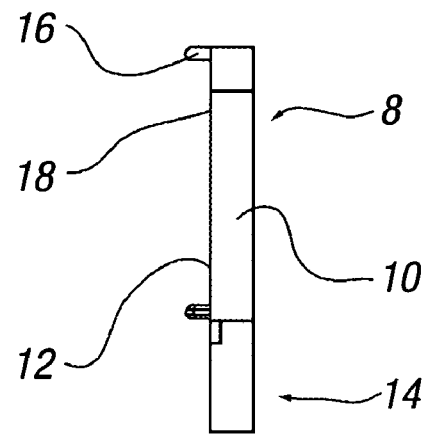
FIGS. 1a-1c illustrate a side view, end view and plan view respectively of protection means in one example of the present invention.
Figure 1B:
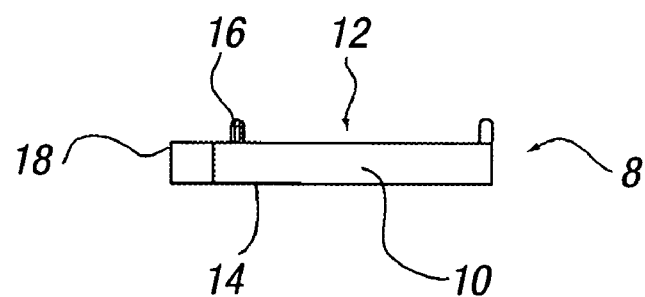
Figure 1C:
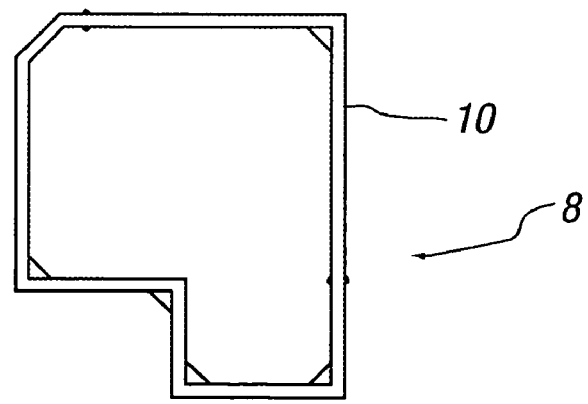
Figure 2:
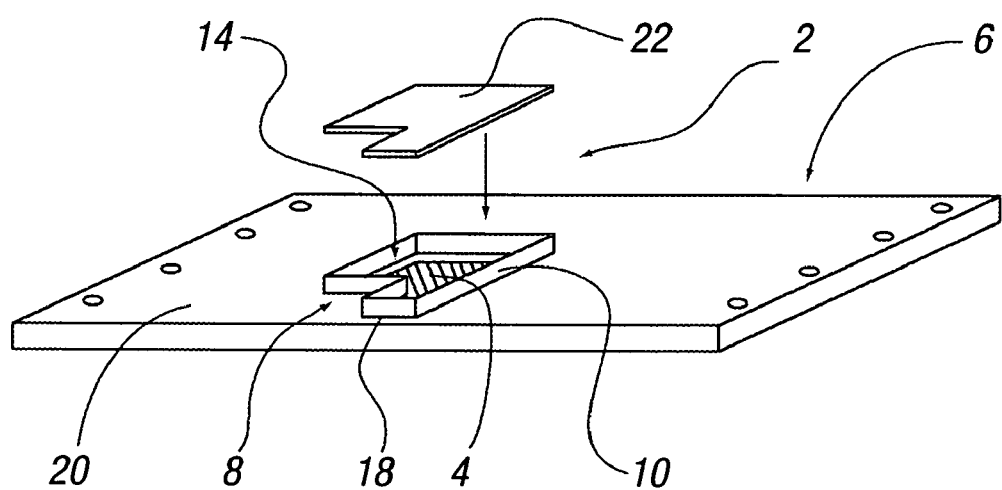
FIG. 2 illustrates use of the protection means in FIGS. 1a-1c on a PCB.

Referring to the figures, there is provided protection means 2 for protecting a FLASH memory component 4 of a PCB 6. The PCB can be for use in any suitable item of electrical apparatus.

The protection means 2 includes a sleeve member 8 having side walls 10, a first open end 12 and a second open end 14. Engagement means in the form of a plurality of pins or feet 16 are provided on edge 18 of sleeve member 8 defining first open end 12. The pins 16 protrude outwardly of sleeve member 8 and are located in recesses on a surface 20 of PCB 6 surrounding component 4 in use. With the sleeve member 8 in place on PCB 6, edges 18 defining the first open end 12 are in contact with the surface 20 of PCB 6.

The sleeve member 8 is of a complementary shape to component 4 and is of slightly larger dimensions. Any suitable shaped sleeve member can be used depending on the size and shape of the component or components being protected.

A fluid in the form of an adhesive is then poured into the sleeve member. The adhesive is poured to a pre-determined height in the sleeve member so as to cover component 4 to a pre-determined thickness. The sleeve member acts as a dam to limit or prevent the flow of adhesive beyond the interior cavity defined by the walls of the sleeve member.

Cover means in the form of a cap 22 is then located over second opening 14 to cap the sleeve member, thereby further limiting the flow of adhesive from the sleeve member to any other component on the PCB. Cap 22 also limits or prevents access to the component 4 to protect the same. Cap 22 in this example is in the form of a tile or plate like member which is of substantially complementary shape to the edges of the sleeve member defining the second opening 14. The cap is formed from mica and is of approximately 1 mm in thickness. The cap typically has a temperature resistance of greater than 1500 degrees Celsius. As such, it allows dissipation of heat applied to the cap, thereby preventing or limiting access to the cap via third parties. The Mica also has a high dielectric strength and excellent chemical stability, thereby making it a suitable material for use in the present invention.

Component 4, including the pins and the body thereof, needs to be covered by the adhesive to a depth of at least 3 mm in this example. The adhesive is ideally required to harden when dry so that the adhesive cannot be peeled off, pierced or removed from the PCB once attached thereto without damaging component 4. The adhesive can be transparent but an opaque adhesive is preferred.

In a preferred embodiment the adhesive needs to be chosen so that the PCB breaks if an attempt to remove the adhesive from the PCB is undertaken. Furthermore, the adhesive typically cures in a time of less than 90 minutes. The exothermic heat generated during curing must be less than the glass transitional temperature of the PCB material, such as FR4 material, in order to prevent bowing or local distortion of the PCB. Thus, in one embodiment the combination of the use of a mica containing cover or cap and use of a hard setting adhesive further increases the security of the protection means of the present invention against third party access to the one or more components being protected by the same.

Preferably the adhesive is an epoxy adhesive, such as DP760 epoxy adhesive supplied by 3M under the trade mark "SCOTCH-WELD". The adhesive typically includes an accelerator component, such as a modified amine.

The protection means therefore substantially isolates the component on the PCB which is to be covered by a fluid or other suitable product and which is to be protected.

While the invention has been described with a certain degree of particularly, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

What is claimed:

1. A printed circuit board with protection means for protecting one or more components of the printed circuit board (PCB) from being tampered with, said protection means comprising:

a sleeve member located on the printed circuit board around at least one component of the printed circuit board;

said sleeve member having walls of a depth such that a product or fluid in said sleeve member covers the component located within the walls of said sleeve member and prevents the spread of the product or fluid externally of said sleeve member;

cover means for covering a whole or substantial part of an opening of said sleeve member; and wherein the cover means is opaque and formed at least partially of mica to dissipate heat and protect against light or electricity applied to the cover to gain access to the one or more components.

2. The printed circuit board according to claim 1 wherein the depth of said walls of said sleeve member is at least 3 mm.

3. The printed circuit board according to claim 1 wherein the fluid is solder or adhesive.

4. The printed circuit board according to claim 1 wherein said sleeve member has side walls with at least a first opening and a second opening defined therein.

5. The printed circuit board according to claim 4 wherein said first opening is provided substantially opposite to said second opening.

6. The printed circuit board according to claim 4 wherein said first opening is provided adjacent to and in contact with a surface of said printed circuit board and said cover means is located on or over said second opening.

7. The printed circuit board according to claim 1 wherein a cross sectional shape of said sleeve member is substantially complementary to a shape of the component being surrounded by said sleeve member.

8. The printed circuit board according to claim 1 wherein said sleeve member is of such dimensions that a pre-determined space is defined between interior walls of said sleeve member and a component located within said sleeve member.

9. The printed circuit board according to claim 1 wherein said one or more components are electrical components.

10. The printed circuit board according to claim 9 wherein said electrical components may be selected from the group consisting of a FLASH memory component, a central processing unit and a processing chip.

11. The printed circuit board according to claim 1 wherein said sleeve member is provided with engagement means for engaging a surface of said printed circuit board and/or said cover means.

12. The printed circuit board according to claim 11 wherein said engagement means includes one or more pins for location in one or more recesses or apertures provided on a surface of the printed circuit board.

13. The printed circuit board according to claim 11 wherein said engagement means are provided on or adjacent walls defining first and/or second openings of said sleeve member.

14. The printed circuit board according to claim 1 wherein said sleeve member is formed from heat resistant material.

15. The printed circuit board according to claim 14 wherein said sleeve member is formed from a plastic material.

16. The printed circuit board according to claim 1 wherein said sleeve member is formed from a plurality of wall members joined together.

17. The printed circuit board according to claim 1 wherein said sleeve member is formed from a plurality of integrally formed walls members.

18. The printed circuit board according to claim 1 wherein said cover means is in the form of a tile or plate like member.

19. The printed circuit board according to claim 1 wherein said cover means is a tile or plate like member substantially complementary to the opening of the sleeve member.

20. Protection means for use with a printed circuit board in accordance with claim 1.

21. A method of protecting one or more components of a printed circuit board from being tampered with, said method including the steps of:

locating a sleeve member around at least one component on a printed circuit board;

locating a product or fluid in the cavity defined by interior walls of the sleeve member to cover the at least one component;

locating cover means over an opening of said sleeve member, and wherein the cover means is opaque and formed at least partially of mica; and dissipating heat and protecting the cover against heat, light or electricity applied to the cover.

* * * * *

UNITED STATES PATENT AND TRADEMARK OFFICE
CERTIFICATE OF CORRECTION

PATENT NO. : 7,807,934 B2  
APPLICATION NO. : 11/430335  
DATED : October 5, 2010  
INVENTOR(S) : Peter Ford and Colin Fuller Page 1 of 1

It is certified that error appears in the above-identified patent and that said Letters Patent is hereby corrected as shown below:

Title page, item (73) Assignee, insert --Pace Plc, Saltaire, Shipley (GB)--

Signed and Sealed this  
Fifteenth Day of February, 2011

David J. Kappos  
*Director of the United States Patent and Trademark Office*